(12) United States Patent
Chen

(10) Patent No.: US 7,877,244 B2
(45) Date of Patent: Jan. 25, 2011

(54) SIMULATION CIRCUIT OF TOGGLE MAGNETIC TUNNEL JUNCTION (MTJ) ELEMENT

(75) Inventor: Young-Shying Chen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 497 days.

(21) Appl. No.: 12/039,337

(22) Filed: Feb. 28, 2008

(65) Prior Publication Data

US 2009/0006050 A1 Jan. 1, 2009

(30) Foreign Application Priority Data

Jun. 29, 2007 (TW) .............................. 96123875 A

(51) Int. Cl.
*G06G 7/48* (2006.01)
*G11C 7/02* (2006.01)
(52) U.S. Cl. .......................................... 703/4; 365/209
(58) Field of Classification Search ..................... 703/4; 365/209
See application file for complete search history.

(56) References Cited

U.S. PATENT DOCUMENTS 6,083,266 A * 7/2000 Ohtsu et al. ..................... 703/2
6,650,562 B2 * 11/2003 Holden et al. ................. 365/97
6,760,266 B2 * 7/2004 Garni et al. .................. 365/209
2002/0093032 A1 * 7/2002 Hanzawa et al. ............. 257/200

OTHER PUBLICATIONS

C.C. Hung et al., Adjacent-Reference and Self-Reference Sensing Scheme with Novel Orthogonal Wiggle MRAM Cell, Electronics and Optoelectronics Research Laboratories, Taiwan, R.O.C.
Chin-Lung Su et al., Testing MRAM for Write Disturbance Fault, International Test Conference, Dept. of Electrical Engineering National Tsing Hua University Hsinchu, Taiwan R.O.C.

* cited by examiner

*Primary Examiner*—Dwin M Craig
(74) *Attorney, Agent, or Firm*—Workman Nydegger

(57) ABSTRACT

A simulating circuit for simulating a toggle magnetic tunneling junction (MTJ) element includes at least a synthetic Anti-Ferromagnetic free layer, a tunnel barrier layer, and a synthetic Anti-Ferromagnetic pinned layer. The simulating circuit is configured with a converting circuit, a status circuit, a storage circuit, a voltage computing circuit and a feature simulating circuit. The convert circuit converts the magnetic filed generated from a write in current to an equivalent voltage. The status circuit indicates the flipping status of the magnetic moment of the free layer. The storage circuit is used for representing data stored in the toggle magnetic tunneling junction element. The arrangement of the magnetic moment of the two Anti-Ferromagnetic adjacent to the tunnel barrier layer is represented by the voltage computing circuit. The voltage-current characteristic is represented by the feature simulating circuit.

16 Claims, 16 Drawing Sheets

SIMULATION CIRCUIT OF TOGGLE MAGNETIC TUNNEL JUNCTION (MTJ) ELEMENT

CROSS-REFERENCE TO RELATED APPLICATIONS

This non-provisional application claims priority under 35 U.S.C. §119(a) on patent application Ser. No. 096123875 filed in Taiwan, R.O.C. on Jun. 29, 2007, the entire contents of which are hereby incorporated by reference.

BACKGROUND

1. Field of Invention

The invention relates to a macro model of a toggle magnetic tunnel junction (MTJ) element, and in particular to a macro model of a toggle magnetic tunnel junction (MTJ) element, that can be utilized in circuit design, and is capable of simulating the read/write operations of a toggle MTJ element.

2. Related Art

The magnetic random access memory (MRAM) is a kind of non-volatile memory, and is used to store and record the data by making use of its electric resistance characteristics, thus having the advantages of non-volatility, high density, high read/write speed, and radiation resistant, etc. The major memory unit of Magnetic Random Access Memory (MRAM) is a magnetic memory unit produced between a write bit line and a write word line, and it is of a stack structure made of multi-layer magnetic metal material, thus it is also referred to as a Magnetic Tunnel Junction (MTJ) element, having a stack structure formed by stacking a soft magnetic layer, a tunnel barrier layer, a hard magnetic layer, and a non-magnetic conduction layer in sequence.

The toggle magnetic tunnel junction (MTJ) element, having the advantages of wide operation range and high thermal stability, and thus is well suitable for application in an embedded system.

The memory state of "0" or "1" of MJT element is determined through the parallel or anti-parallel alignment of the magnetic-moment configurations of two layers of ferromagnetic material adjacent to the tunnel barrier layer. As such, the data-write-in is realized through a cross selection of a write bit line and a write word line, wherein, the change of magnetization direction of a memory layer magnetic material is achieved through a magnetic field generated by the current flowing in the write bit line and write word line, so as to change the value of electric resistance, hereby realizing the objective of data-write-in.

Referring to FIG. 1A for a schematic diagram of a structure of an exemplary toggle magnetic tunneling junction (MTJ) element. As shown in FIG. 1A, the MTJ element is composed of a anti-ferromagnetic pinning layer 10, a fixed layer 20 formed on anti-ferromagnetic pinning layer 10, a tunnel barrier layer 30 formed on fixed layer 20, and a free layer 40 formed on top of tunnel barrier layer 30. The fixed layer 20 and free layer 40 are both of synthetic anti-ferromagnetic configuration. An upper electrode 51 is formed on top of the free layer 40, while a lower electrode 52 is formed below an anti-ferromagnetic pinning layer 10. The upper electrode 51 and lower electrode 52 are connected with a metallic wire, thus forming a route for reading data. Located above and below the upper electrode 51 and the lower electrode 52 are a write bit line (WBL) and write word line (WWL) respectively, as shown in FIG. 1B, so that a magnetic field is generated, when a write-in current flows through. In addition, the upper electrode 51 is connected to a read-bit-line (RBL).

The anti-ferromagnetic pinning layer 10 is made of an anti-ferromagnetic material, such as PtMn or IrMn. The fixed layer 20 formed on an anti-ferromagnetic pinning layer 10 is a stack formed by more than one ferromagnetic layers. As shown in FIG. 1A, the composite anti-ferromagnetic fixed layer is a three-layer structure formed by stacking ferromagnetic material, non-magnetic metal, and ferromagnetic material sequentially, so that the directions of magnetic moments of the two ferromagnetic layers are in anti-parallel alignment, and it can be made by for example, CoFe/Ru/CoFe, NiFe/Ru/NiFe, or CoFeB/Ru/CoFeB. The tunnel barrier layer 30 formed on fixed layer 20 is made of a material, such as AlOx or MgO. The freedom layer 40 formed on tunnel barrier layer 30 is a stack of more than one layer of ferromagnetic material, and it can be selected from one of NiFe, CoFe, CoFeB.

In FIG. 1A, the fixed layer 20 is a three-layer structure, composed of magnetic layers 21 and 23 made of ferromagnetic material, and a middle layer 22 made of non-magnetic metal. In addition, the freedom layer 40 is also a three-layer structure, composed of magnetic layers 41 and 43 made of ferromagnetic material, and a middle layer 42 made of non-magnetic metal. The magnetic layers 41 and 43 in freedom layer 40 each having its respective magnetic moments 61 and 62, and are kept in anti-parallel alignment through coupling of the middle layer 42. The magnetic moments 63 and 64 of the magnetic layers 21 and 23 in fixed layer 20 are kept in anti-parallel alignment. The directions of magnetic moments of magnetic layers 41 and 43 in free layer 40 can rotate freely through applying a magnetic field; while the magnetization directions of magnetic layers 21 and 23 in fixed layer 20 will not rotate through applying a magnetic field, thus serving as a reference layer.

In writing data into memory, the method usually utilized is first selecting a memory unit through the intersection of the induced magnetic fields generated by a write bit line and a write word line, and then changing its value of electric resistance through varying the magnetization direction of the free layer 40. While reading data from memory, current must be supplied to the magnetic memory unit thus selected, and then reading the value of electric resistance in determining the digital value of the data. Due to the anti-parallel coupling effect between the magnetic layers 41 and 43 of the free layer 40, such that the write-in operation area and sequential introduction write-in manner of toggle MTJ element are as shown in FIGS. 2A & 2B, and is referred to as a first-in first-out mode, namely, the current that is made to conduct and flow first, will be made to stop first. For example, in FIG. 2A, the current IW on a write word line is made to conduct and flow first, then the current IB on a write bit line is made to conduct and flow. Thus, only when the current IW on write word line is made to stop, then the current IB on the write bit line will be made to stop. Conversely, the write operation areas 71 and 73 are as shown in FIG. 2B, when the current IW of write word line is first made to conduct and flow, then the magnetic moments 61 and 62 of magnetic layers 41 and 43 will rotate in a clockwise direction 72; and when current IB of write bit line is made to conduct and flow, then the magnetic moments 61 and 62 of magnetic layers 41 and 43 will rotate in a counter-clockwise direction 74.

Due to the sequential introduction write-in manner, the circuit model of Toggle MTJ element write operation can be accurately and correctly described, and that is essential to the correct simulation and verification of circuit design.

SUMMARY OF THE INVENTION

In view of the above-mentioned drawbacks and shortcomings of the prior art, the objective of the invention is to provide a simulation circuit of a magnet tunnel junction (MTJ) element, that can be utilized to correctly simulate the circuit model of read/write operations of a toggle MTJ element, and be applied in circuit design of magnetic RAM (MRAM).

In the invention, an embodiment is disclosed to simulate a toggle magnetic tunnel junction (MTJ) element, which comprises at least a synthetic anti-ferromagnetic free layer, a tunnel barrier layer, and a synthetic anti-ferromagnetic fixed layer. Thus, the magnitude of the value of electric resistance is determined by the parallel or anti-parallel alignment of the magnetic-moment configuration of the two ferromagnetic layers adjacent to a tunnel barrier layer. Wherein, the simulation circuit includes a conversion circuit, a state indication circuit, a write data storage circuit, a magnetic-moment configuration voltage calculation circuit, and a characteristics simulation circuit. Wherein, the conversion circuit is used to convert the magnetic field generated by write-in current to an equivalent voltage; the state indication circuit is used to indicate the magnetic-moment reversal state of a free layer adjacent to a tunnel barrier layer; the write data storage circuit is used to indicate the data stored by a MTJ element; the magnetic-moment configuration voltage calculation circuit is used to indicate the magnetic-moment alignment relations of the two ferromagnetic layers adjacent to a tunnel barrier layer, when a MTJ element is in operation; and the characteristics simulation circuit is used to indicate the voltage vs current characteristics of a MTJ element.

In an embodiment of the invention, the macro model of the toggle MTJ element as disclosed in the invention can be utilized in circuit design, and is capable of simulating the read/write operations of MTJ element. This model may dictate that the data write-in manner of toggle MTJ element must follow the operation characteristics of sequential introduction; the value of electrical resistance of MTJ element after write-in can be automatically switched and memorized according to the write-in state (parallel or anti-parallel), and thus it may simulate the effect of decrease of magneto-resistance ratio (MR %) as the read bias increase. In the above mentioned model, the toggle MTJ element parameters, such as the write-in operation area inversion field, the wire resistance values of the write bit line (WBL) and the write word line (WWL), and the magnetic field generation efficiency of the related current can be obtained from the real measurement values.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will become more fully understood from the detailed description given hereinbelow for illustration only, and thus are not limitative of the present invention, and wherein.

DETAILED DESCRIPTION OF THE INVENTION

The purpose, construction, features, and functions of the invention can be appreciated and understood more thoroughly through the following detailed description with reference to the attached drawings. The purpose of the following preferred embodiments is to describe further the various aspects of the invention, and that is not intended in any way to restrict the scope of the invention.

In the following, the structure and operation of the toggle magnetic tunnel junction (MTJ) element of the invention will be described in detail.

Figure 3:
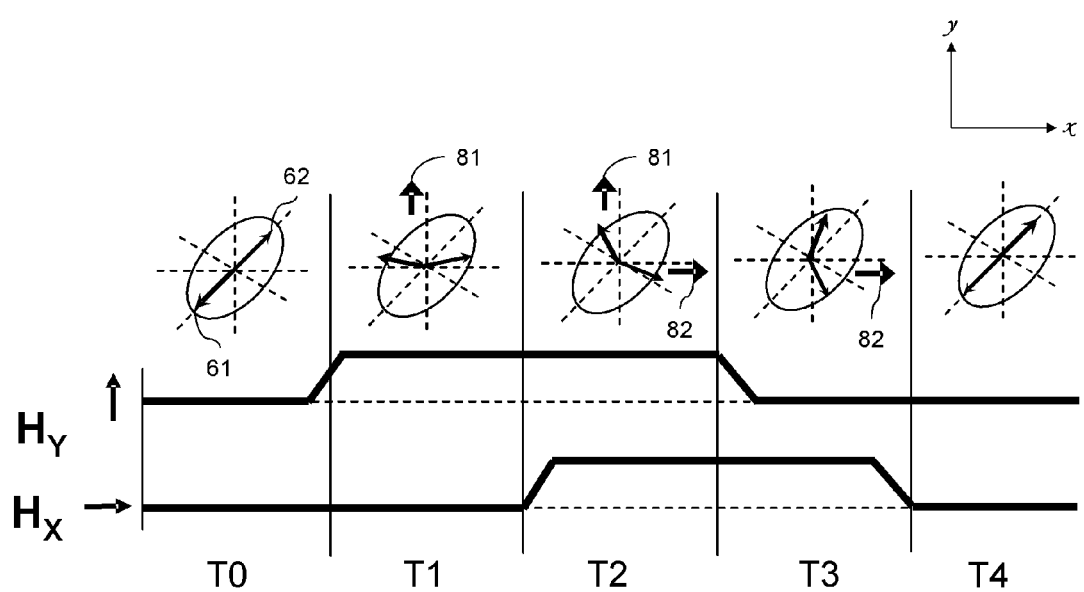
FIG. 3 is a sequential introduction write waveform of a toggle magnetic tunnel junction (MTJ) element of the invention.

Firstly, referring to FIG. 3, for a sequential write introduction waveform of a toggle MTJ element according to an embodiment of the invention.

In time interval T0, the magnetic moments 61 and 62 align to the easy axis of a toggle MTJ element, hereby forming an angle of 225° and 45° with the X axis in the positive direction, respectively.

Next, in time interval T1, the current of write word line is made to conduct and flow, hereby generating a magnetic field 81 along the Y axis in the positive direction, thus making the magnetic moments 61 and 62 start to rotate. The anti-parallel exchange coupling between the magnetic layers 41 and 43 of a free layer 40 will affect the magnetic moments 61 and 62 to rotate a small angle along the direction of the magnetic field. As such, the resultant magnetic moment (not shown) of magnetic moments 61 and 62 aligns in the direction of magnetic field 81, and rotating in a clockwise direction.

Then, in time interval T2, the current of write bit line is made to conduct and flow, thus generating a magnetic field 82 along X axis in the positive direction. The magnetic field 81 along Y axis and the magnetic field 82 along the X axis, both in the positive directions, will make the resultant magnetic moment rotate further in a clockwise direction, until it roughly align in an anisotropy easy axis direction, and the direction of easy axis is 45° relative to the X axis in the positive direction.

Subsequently, in time interval T3, the current of write word line is made to stop, so that during T3, only the magnetic field 82 along the X axis in the positive direction remains, thus the resultant magnetic moment will align in the direction of magnetic field 82. At this stage, the rotations of the magnetic moment 61 and 62 have already passed the anisotropy hard axis.

Finally, at time interval T4, the current of write bit line is made to stop, and due to the anti-parallel exchange coupling between the magnetic layers 41 and 43, such that the directions of magnetic moments 61 and 62 align with that of an anisotropy easy axis, hereby indicating an anti-parallel arrangement to achieve the minimum energy state. Taking magnetic moment 61 as an example, at time interval T4, the direction of magnetic moment 61 is aligned with an anisotropy easy axis having an angle of 45°. Compared with its initial angle of 225° at time interval T0, the difference of 180° indicates that the state of magnetic moment 61 has been inverted. Thus, in case that at time interval T0, the logic states of magnetic moments 61 and 62 are defined as "1", then at time interval T4, the logic states of magnetic moments 61 and 62 are defined as "0".

In the above analyses, clockwise rotation is utilized to describe the sequential write mode of the toggle MTJ element of the invention. However, it is possible to make the conducting of the current of write word line and current of write bit line in opposite sequence, so that magnetic moments 61 and 62 rotate in a counter-clockwise direction, hereby reversal the state of memory.

Figure 4:
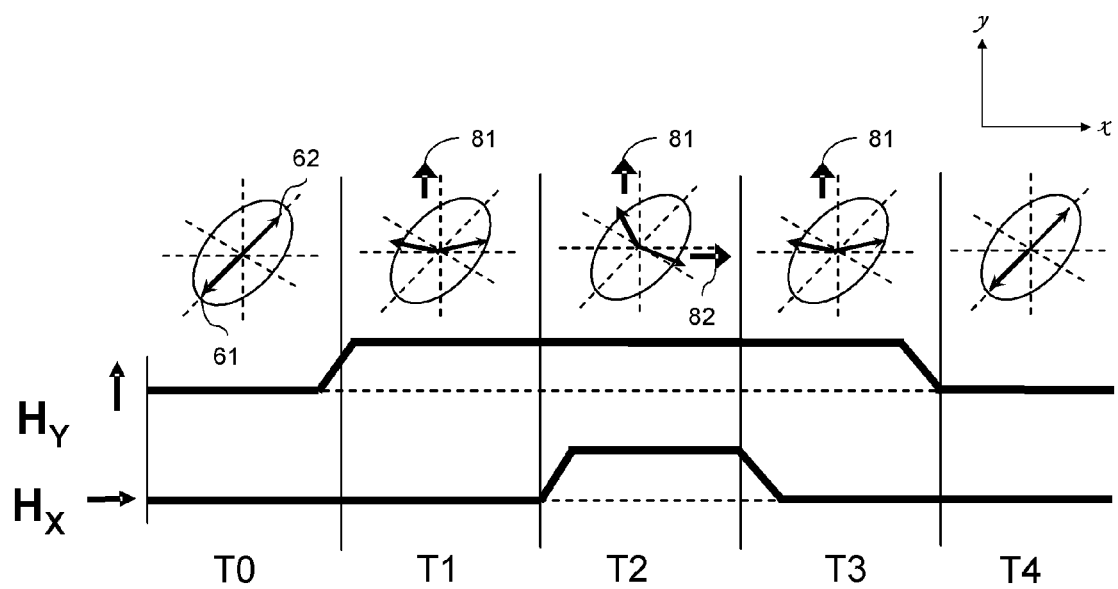
FIG. 4 is an erroneous sequential introduction write waveform in time interval T3 of a toggle magnetic tunnel junction (MTJ) element of the invention.

Referring to FIG. 4, for a sequential write introduction waveform of a toggle MTJ element according to an embodiment of the invention, in time interval T3, the current of write bit line is made to stop, so that during T3, only the magnetic field 81 along the Y axis in the positive direction remains, thus the resultant magnetic moment will align in the direction of magnetic field 81 again. At this stage, the rotations of the magnetic moments 61 and 62 have got back to the state same as time interval T1. Finally, at time interval T4, the current of write word line is made to stop, and due to the anti-parallel exchange coupling between the magnetic layers 41 and 43, such that the directions of magnetic moments 61 and 62 align with that of an anisotropy easy axis and recover their original state.

In the above time sequence of from time interval T0 to time interval T4, the current of write word line is first made to conduct and flow, next the current of write bit line is made to conduct and flow, then the current of write word line is made to stop, and finally the current of write bit line is made to stop, thus this kind of timing mode is referred to as a first-in-first-out mode.

Figure 5:
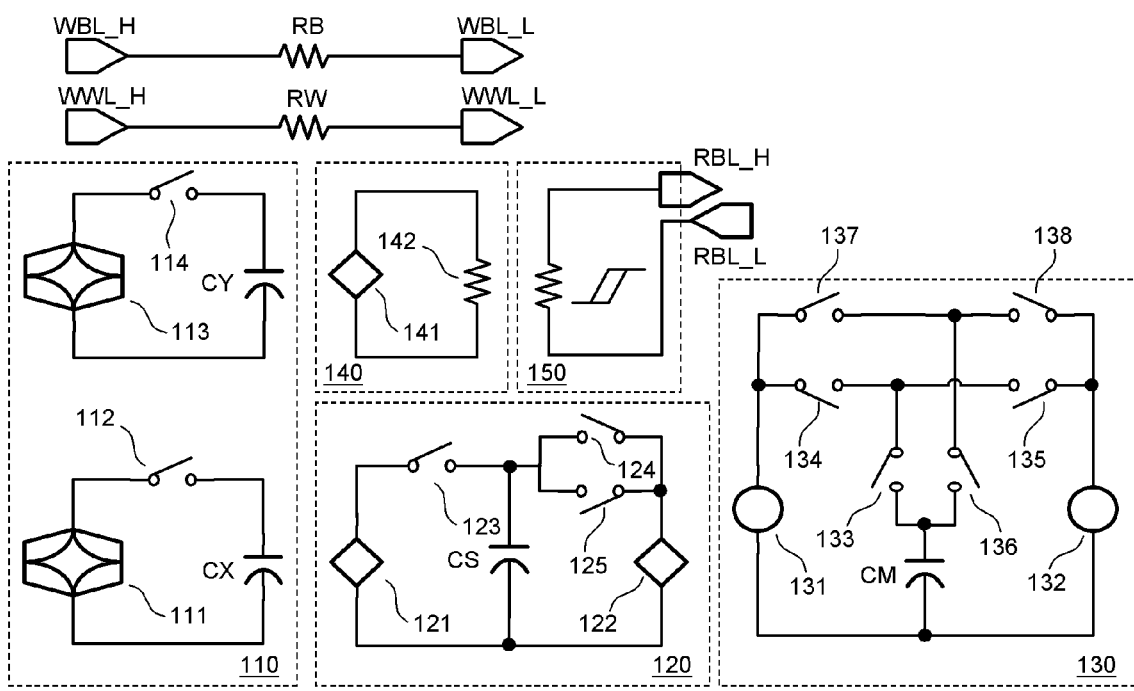
FIG. 5 is a circuit diagram of a simulated toggle magnetic tunnel junction (MTJ) element of the invention.

Referring to FIG. 5 for a circuit diagram of a toggle magnetic tunnel junction (MTJ) element for implementing the read/write operations according to an embodiment of the invention. As shown in FIG. 5, the toggle MTJ element includes a conversion circuit 10, a state indication circuit 120, a write data storage circuit 130, a magnetic moment configuration voltage calculation circuit 140, and a characteristic simulation circuit 150. In the embodiment as shown in FIG. 5, the equivalent circuit is created mainly by making use of a linear controlled voltage/current element embedded in simulation design software HSPICE.

In the above structure, the conversion circuit 110 is used to convert the magnetic field generated by the write current into an equivalent voltage, including a first voltage source 111, a first switch 112, a first sequential capacitor CX, a second voltage source 113, a second switch 114, and a second sequential capacitor CY. Wherein, a first voltage source 111 and a first sequential capacitor CX are connected in series with a first switch 112, and a first switch 112 is connected electrically between a first voltage source 111 and a first sequential capacitor CX. A second voltage source 113 and a second sequential capacitor CY are connected in series with a second switch 114, and a second switch 114 is connected electrically between a second voltage source 113 and a second sequential capacitor CY. The first switch 112 is controlled by a second voltage source 113, and the second switch 114 is controlled by the first voltage source 111.

The second switch 114 controlled by the first voltage source 111, and first switch 112 controlled by a second voltage source 113 are normal short-circuit voltage control switches, respectively. When the voltage HY of the second voltage source 113 is greater than the write threshold field equivalent voltage VSF of a toggle MTJ element, the first switch 112 is in an open state. And when the voltage HX of the first voltage source 111 is greater than the write threshold field equivalent voltage VSF of a toggle MTJ element, the second switch 114 is in an open state.

In addition to converting the magnetic field generated by the currents of write bit line and write word line into an equivalent voltage sources (voltage HX is provided by the first voltage source 111, and voltage HY is provided by the second voltage source 114), the conversion circuit 110 also record the direction of T1 introduction route into a first sequential capacitor CX and a second sequential capacitor CY.

The state indication circuit 120 is used to depict the magnetic moment reversal state of a free layer. The state indication circuit 120 includes a third voltage source 121, a fourth voltage source 122, a state capacitor CS, a third switch 123, a fourth switch 124, and a fifth switch 125. The third voltage source 121 and the fourth voltage source 122 are a kind of voltage controlled voltage source. The state capacitor CS is used to record the magnetic moment reversal state of a free layer. The third voltage source 121 and the third switch 123 form a loop with the state capacitor CS. The fourth switch 124 and the fifth switch 125 are connected in parallel, and are connected electrically between the state capacitor CS and the fourth voltage source 122, and are used to describe a bi-direction introduction route. The third switch 123, the fourth switch 124 and the fifth switch 125 belong to a kind of voltage-controlled combined logic switch.

The voltage EVS of the fourth voltage source 122 is set to the voltage VCM of a storage capacitor CM, hereby representing the state of direction of magnetic moment before data writing. The voltage EVSR of the third voltage source 121 is set to the negative voltage −VCM of a storage capacitor CM, hereby representing state of magnetic moment direction after the next data writing.

At time interval T2, both the voltage HX of the first voltage source 111 and the voltage HY of the second voltage source 113 are greater than a write threshold field equivalent voltage VSF of a toggle MJT element, thus the third switch 123 is closed. The third voltage source 121 is used to charge a state capacitor CS to voltage −VCM, and that indicates that the state of magnetic moment of the free layer is just pre-reversed to the direction after the next data writing.

In the following, the switching control of a fourth switch 124 and a fifth switch 125 is described. When one of voltage HX of the first voltage source 111 and the voltage VCY of a second sequential capacitor CY is less than the write threshold field equivalent voltage VSF, then the fourth switch 124 is closed. When one of voltage HY of the second voltage source 113 and the voltage VCX of a first sequential capacitor CX is less than the write threshold field equivalent voltage VSF, then the fifth switch 125 is closed.

In time interval T2 and during a normal sequential introduction waveform, the fourth switch 124 and the fifth switch 125 are open circuits. Once in time interval T3 and the introduction sequence is as shown in FIG. 4, one of the fourth switch 124 and the fifth switch 125 is closed, so that the voltage of state capacitor CS charges back as the voltage EVS of a fourth voltage source 122, hereby recovering the state of the magnetic moment of free layer back to the state before data writing, that indicates a data writing failure.

The write data storage circuit 130 includes: a fifth voltage source 131, a sixth voltage 132, a storage capacitor CM, a sixth switch 133, a seventh switch 134, an eighth switch 135, a ninth switch 136, a tenth switch T37, and an eleventh switch 138.

In the write data storage circuit 130, the fifth voltage source 131 and the sixth voltage source 132 represent respectively the states of the two directions, when the magnetic moments of free layer adjacent to a tunnel barrier layer are in stable state. The voltage VKH of the fifth voltage source 131 is set to VK, and voltage VKL of the sixth voltage source 132 is set to −VK, wherein, VK>VSF.

The sixth switch 133, the seventh switch 134, the eighth switch 135, the ninth switch 136, the tenth switch 137, and the eleventh switch 138 form two charging routes connected in parallel between storage capacitor CM, the fifth voltage source 131, and the sixth voltage source 132. The first charging route is composed of the sixth switch 133, the seventh switch 134, and the eighth switch 135; while the second charging route is composed of the ninth switch 136, the tenth switch 137, and the eleventh switch 138. The above-mentioned switches belong to a kind of voltage controlled combined logic switch, and the route selection is controlled by the normal short-circuit of the sixth switch 133 and the ninth switch 136. The sixth switch 133 is controlled by the second voltage source 113, while ninth switch 136 is controlled by the first voltage source 111. When the voltage HX of the first voltage source 111>ΔV~0, the sixth switch 133 is open. When the voltage HY of the second voltage source 113>ΔV~0, the ninth switch 136 is open. As such, in case that in time interval T3 the introduction sequence is in error, then the charging route of the storage capacitor CM will be open-circuited, thus it will not change the voltage value of storage capacitor CM.

The data writing in the first charging route is controlled by a seventh switch 134 and an eighth switch 135. When voltage VCS of storage capacitor CS is greater than the write threshold field equivalent voltage VSF, and voltage HX of the first voltage source 111 is greater than the write threshold field equivalent voltage VSF, the seventh switch 134 is closed. When the voltage −VCS of storage capacitor CS is greater than the write threshold field equivalent voltage VSF, and voltage HX of the first voltage source 111 is greater than the write threshold field equivalent voltage VSF, the eighth switch 135 is closed.

The data writing in the second charging route is controlled by a tenth switch 137 and an eleventh switch 138. When voltage VCS of storage capacitor CS is greater than the write threshold field equivalent voltage VSF, and voltage HY of the second voltage source 113 is greater than the write threshold field equivalent voltage VSF, the tenth switch 137 is closed. When the voltage −VCS of storage capacitor CS is greater than the write threshold field equivalent voltage VSF, and voltage HY of the second voltage source 113 is greater than the write threshold field equivalent voltage VSF, the eleventh switch 138 is closed. Only through the correct data writing introduction in time interval T3, the voltage of storage capacitor CM can be written in again, meanwhile, the voltage values of a third voltage source 121 and a fourth voltage source 122 in a state indication circuit 120 are updated.

The magnetic moment configuration voltage calculation circuit 140 includes a seventh voltage source 141 and a resistor 142 connected in series. Voltage VT of the seventh voltage source 141 indicates the configuration voltage of magnetic moment, and is used to describe the magnetic moment alignment relations of the two ferromagnetic layers adjacent to a tunnel barrier layer, when a toggle MTJ is in operation. The linear combination of voltage of state capacitor CS and the voltage of storage capacitor CM is set as follows: VT=PT1×VCS+PT2×VCM. While in a stable state, the magnetic moment 62 of a magnetic layer 43 of freedom layer, and the magnetic moment 63 of magnetic layer 21 of a fixing layer 21 are in parallel or anti-parallel alignment, then the configuration constants PT1 and PT2 are both set to ½; and when in a stable state, the magnetic moment 62 of a magnetic layer 43 of freedom layer, and the magnetic moment 63 of magnetic layer 21 of a fixing layer are in orthogonal alignment, then the configuration constants PT1 and PT2 are set to ½ and −½ or −½ and ½.

The I-V characteristic of toggle MTJ element can be expressed by a Simmon's equation $I_{MTJ}=A_{MTJ}\times[\theta\times[1+\gamma(V_{MTJ})^2]]\times V_{MTJ}$, wherein, $\theta$ is related to RA value, and $\gamma$ determines the effect of the magneto-resistance ratio MR % decrease as the read bias increase. Parameters $\theta$ and $\gamma$ can be linearly adjusted by the magnetic moment configuration voltage VT, and its value is between $(\theta_{AP}\sim\theta_P)$ and $(\gamma_{AP}\sim\gamma_P)$. Wherein, the two sets of parameters $(\theta_{AP}\sim\theta_P)$ and $(\gamma_{AP}\sim\gamma_P)$ can be obtained from the HIGH and LOW states of I-V characteristics. In HSPICE, the magnetic moment configuration voltage VT is a linear combination of voltages registered in storage capacitor CM and state capacitor CS.

In characteristic simulation circuit 150, the I-V characteristics of MTJ element is described by making use of a voltage controlled current source, and that is a linear combination of a voltage $V_{MTJ}$ applied at both ends of an MTJ element and a magnetic moment configuration voltage VT: $I_{MTJ}=A_{MTJ}\times[P2\times V_{MTJ}+P4\times(VT\times V_{MTJ})+P9\times(VT)^3+P13\times VT\times(V_{MTJ})^3+P18\times(VT)^2\times(V_{MTJ})^3]$, wherein, $A_{MTJ}$ is the area of MTJ element.

The simulation verifications of macro model disclosed by the invention are as shown in FIG. 6A to FIG. 9B, the simulations are performed on two consecutive data writing operations, and the current value of MTJ is read by making use of 0.4V voltage, the inversion field of toggle MTJ element is HSF=40 Oe, the magnetic field generation efficiency of the currents of write bit line (WBL) and write-word-line (WWL) are set to 8 Oe/mA, RL=10 KΩ, MR=30%@0V. The variations of the voltages of storage capacitor, state capacitor and the configuration voltage VT in a data writing process all correspond to the reversal behavior of the magnetic moment of free layer.

Figure 1A:
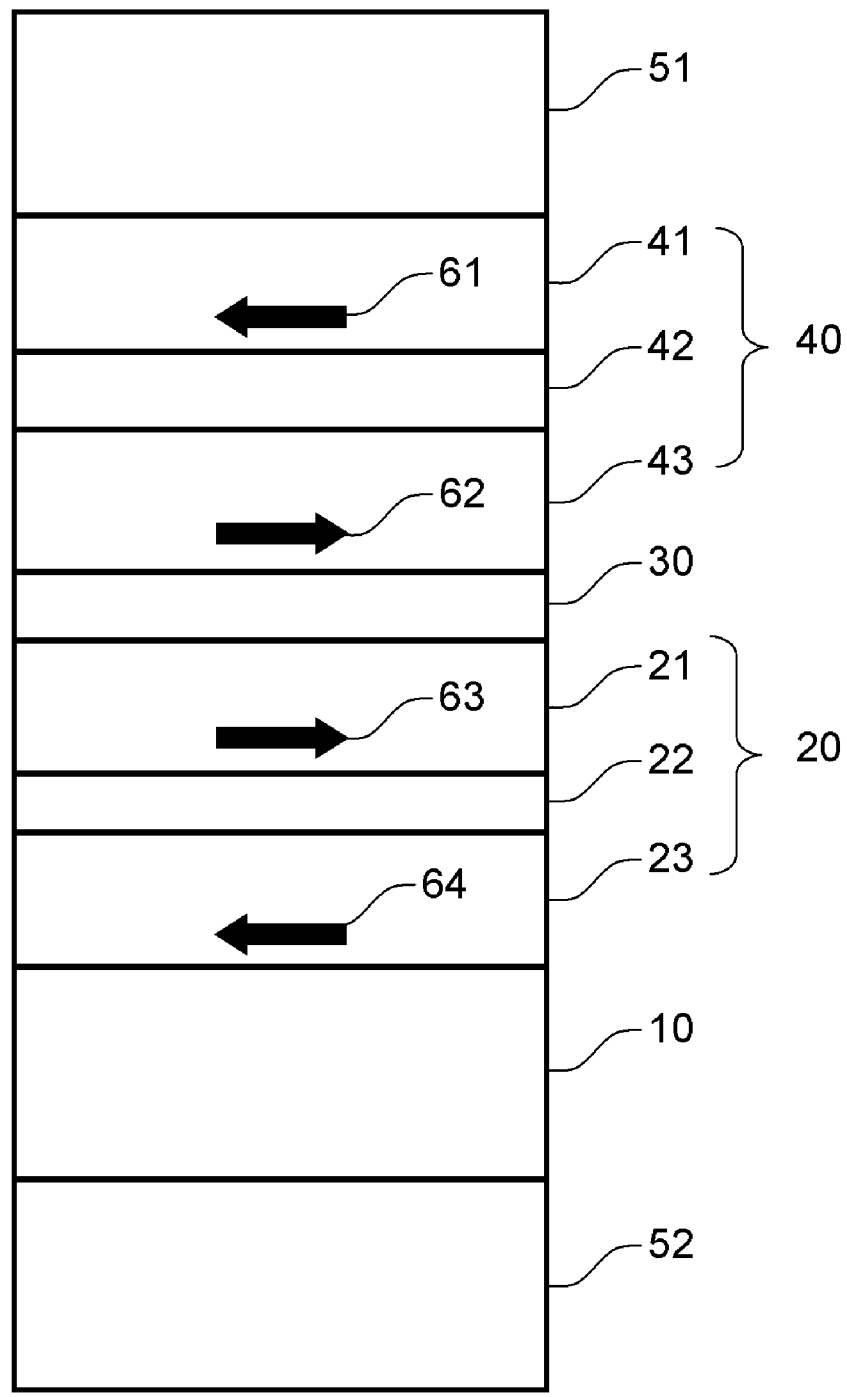
FIG. 1A is a schematic diagram of a structure of a toggle magnetic tunnel junction (MTJ) element of the prior art.
Figure 1B:
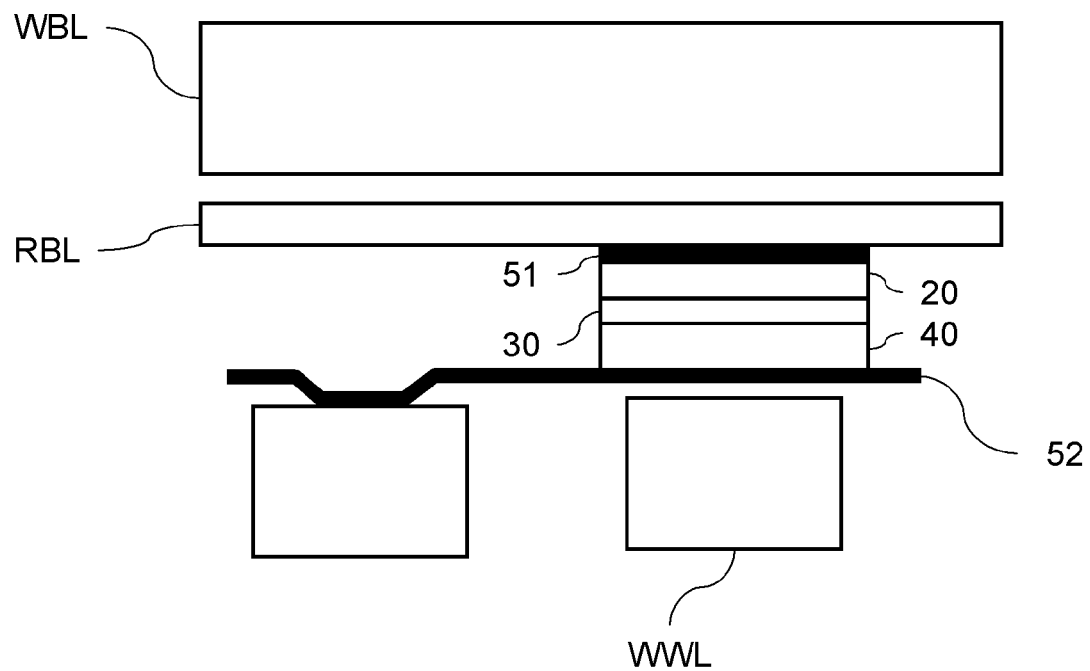
FIG. 1B is a schematic diagram of a structure of a magnetic random access memory (MRAM) of the prior art.
Figure 2A:
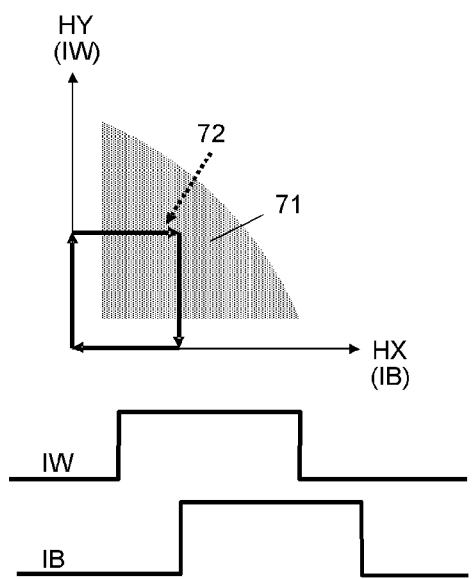
FIGS. 2A~2B are the schematic diagrams of a operation area and write sequence of a toggle magnetic tunnel junction (MTJ) element of the prior art.
Figure 2B:
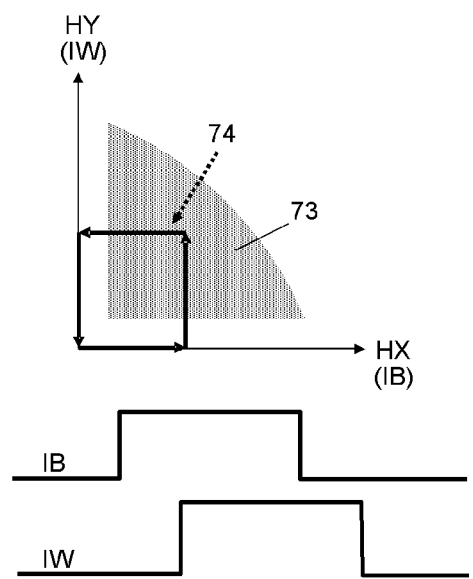
Figure 6A:
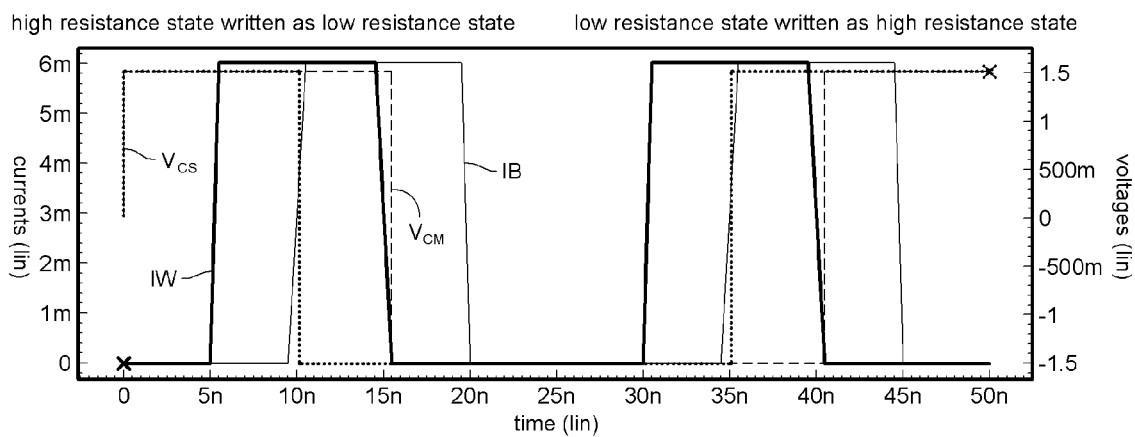
FIGS. 6A~6B are the simulation verifications of the macro model designed to simulate the operations as shown in FIG. 2A with write waveform as shown in FIG. 3.
Figure 6B:
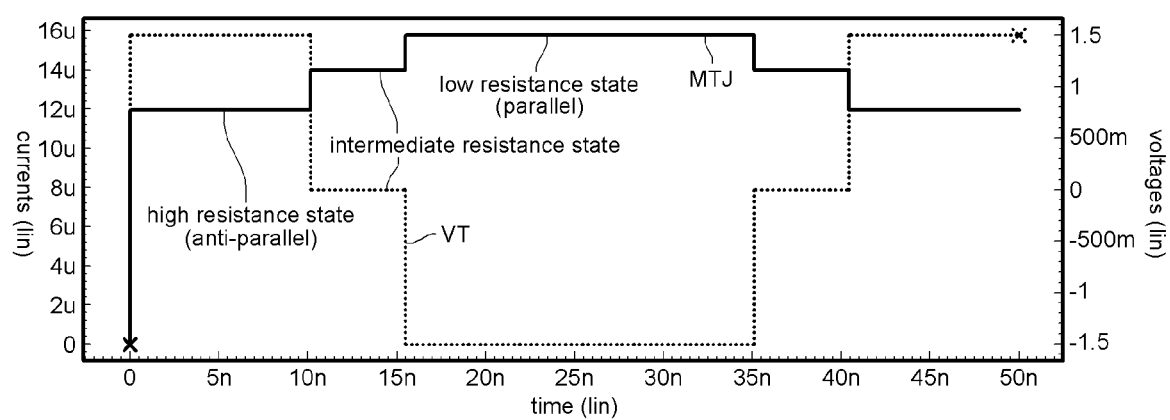
Figure 8A:
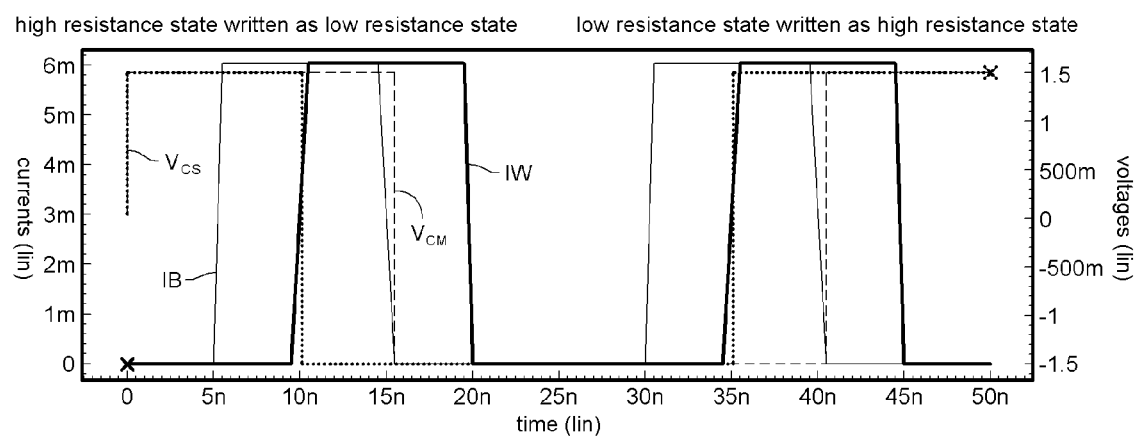
FIGS. 8A~8B are the simulation verifications of the macro model designed to simulate the operations as shown in FIG. 2B.
Figure 8B:
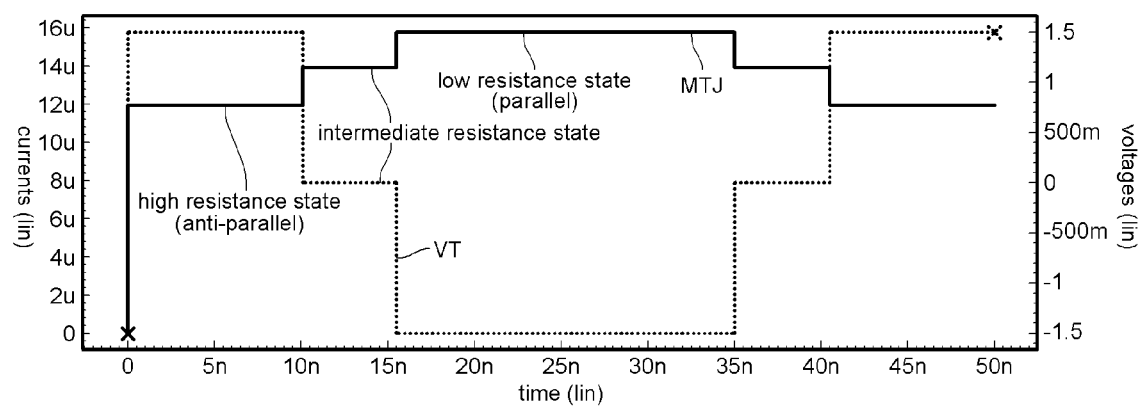

The simulation verifications of the macro model disclosed in the invention as shown in FIGS. 6A & 6B is designed to simulate the operations as shown in FIG. 2A. And the simulation verification of the macro model disclosed in the invention as shown in FIGS. 8A & 8B is designed to simulate the operations as shown in FIG. 2B.

Figure 7A:
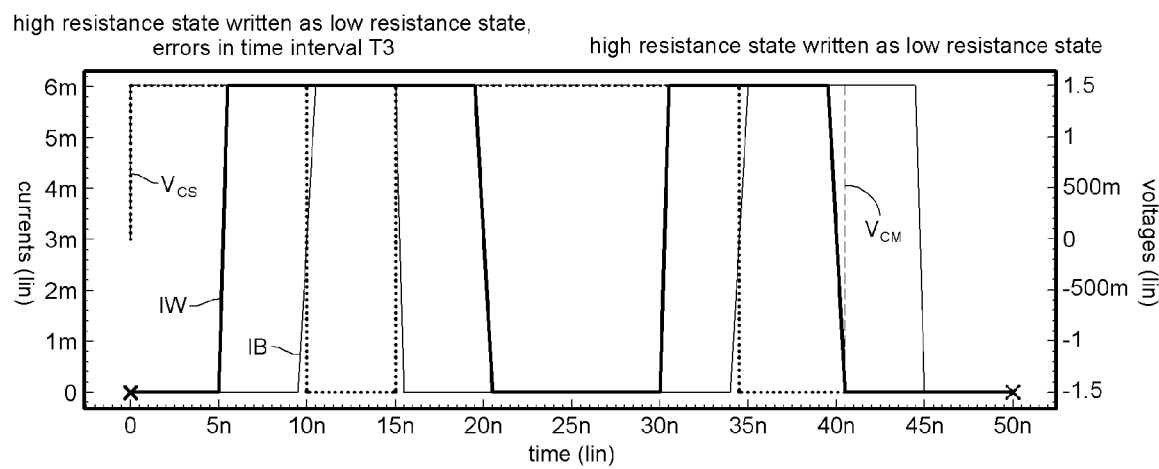
FIGS. 7A~7B are the simulation verifications of the macro model designed to simulate the operations as shown in FIG. 2A with an erroneous write waveform as shown in FIG. 4.
Figure 7B:
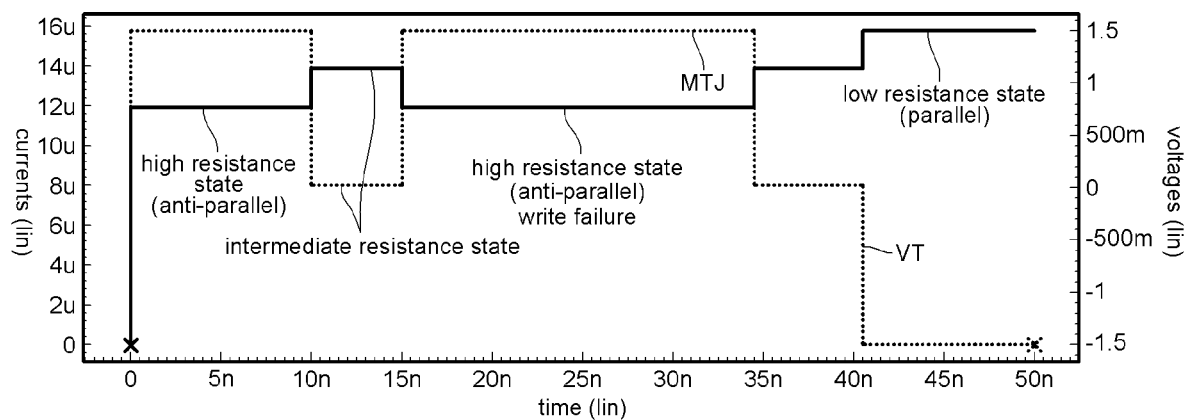
Figure 9A:
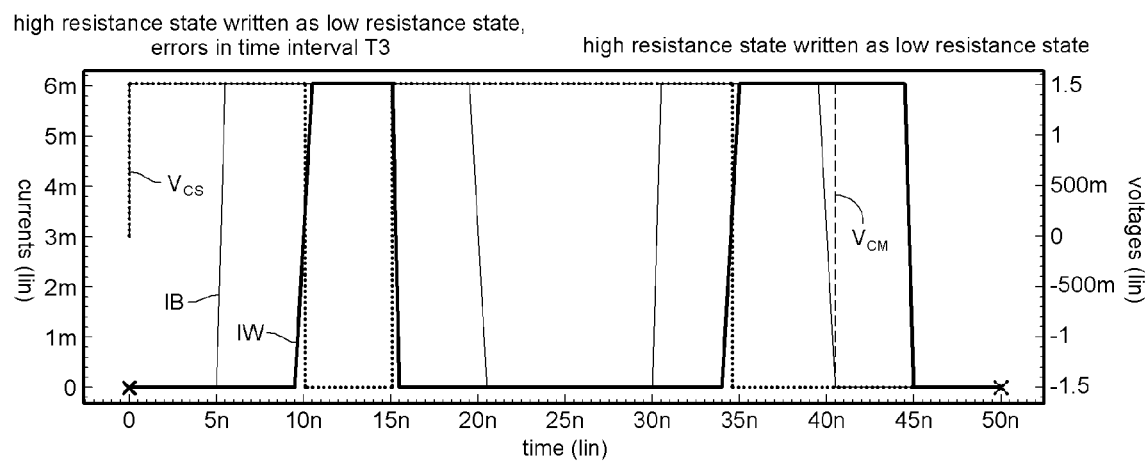
FIGS. 9A~9B are the simulation verifications of the macro model designed to simulate the operations as shown in FIG. 2B, including the simulation of data writing failure.
Figure 9B:
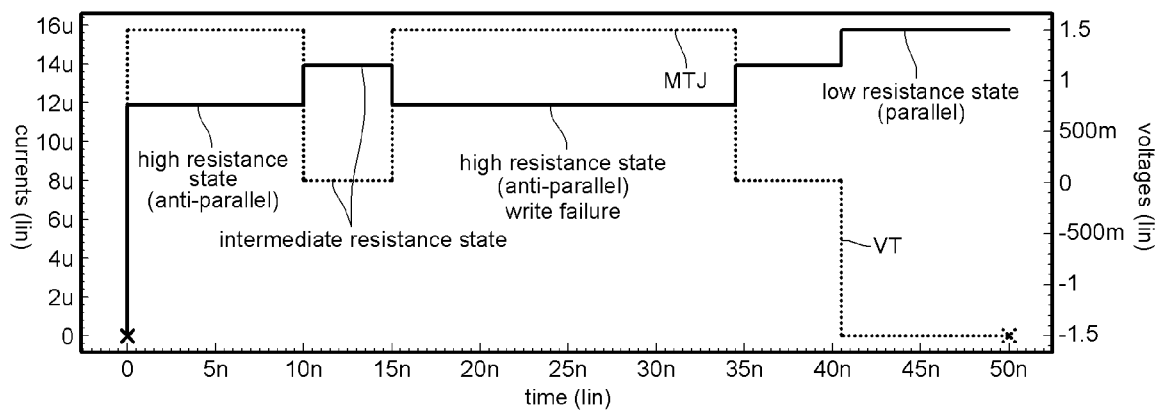
Figure 10A:
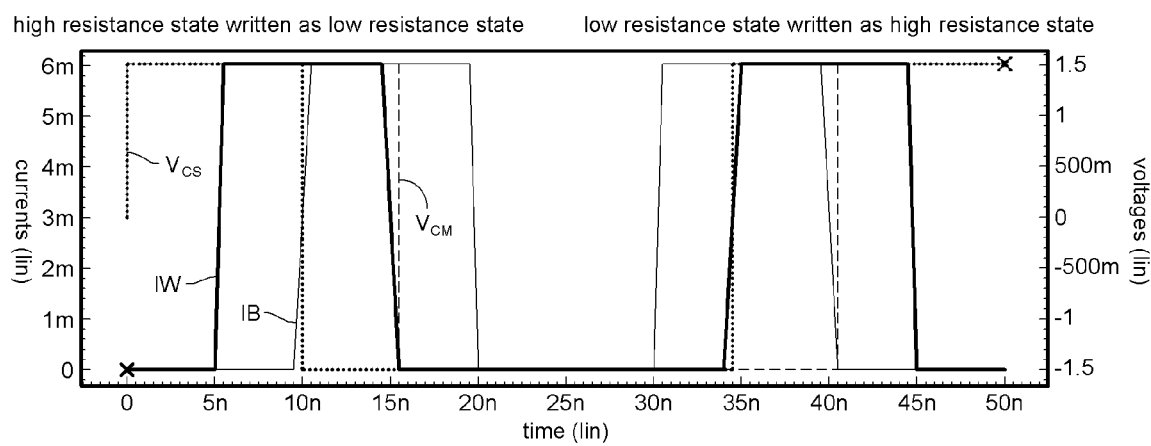
FIGS. 10A~10B are the simulation verifications of the macro model designed to simulate the operations as shown in FIGS. 2A & 2B simultaneously.
Figure 10B:
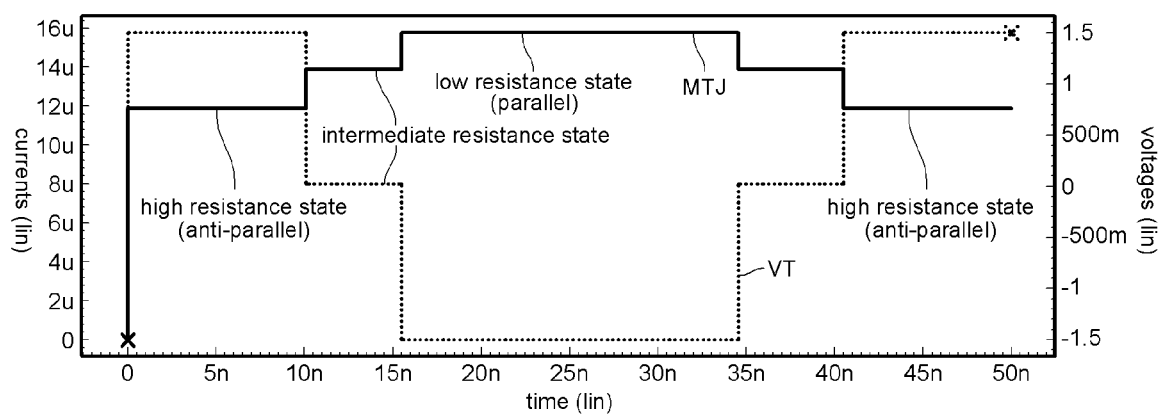

In case that the introduction sequence is in error during time interval T3, then the simulation results of the operation mode shown in FIG. 2A are as shown in FIGS. 7A & 7B. And the simulation results of the operation mode shown in FIG. 2B are as shown in FIGS. 9A & 9B. And the simulation results as shown in FIGS. 10A & 10B is designed to simulate the operations shown in FIGS. 2A & 2B simultaneously.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A simulation circuit of magnetic tunnel junction (MTJ) element, used to simulate a toggle MTJ element, the MTJ element includes at least a synthetic anti-ferromagnetic free layer, a tunnel barrier layer, and a synthetic anti-ferromagnetic fixed layer, thus the variations of the electric resistance value is dependent on the parallel or anti-parallel alignment of the magnetic moments of two ferromagnetic layers adjacent to the tunnel barrier layer, the simulation circuit comprising:
   a conversion circuit, used to convert the magnetic field generated by the currents of write word/bit lines into an equivalent voltage;
   a state indication circuit, used to indicate the magnetic moment reversal state of the free layer;
   a write data storage circuit, used to indicate the data stored by the MTJ element;
   a magnetic moment configuration voltage calculation circuit, used to indicate the alignment relations of the magnetic moments of the two ferromagnetic layers adjacent to the tunnel barrier layer, when the MTJ element is in operation; and
   a characteristic simulation circuit, used to indicate the voltage vs current characteristic of the MTJ element.

2. The simulation circuit as claimed in claim 1, wherein the conversion circuit includes: a first voltage source, a first sequence capacitor, and a first switch connected in series; a second voltage source, a second sequence capacitor, and a second switch connected in series, wherein, the first switch is connected electrically between the first voltage source and the sequence capacitor, the second switch is connected electrically between the second voltage source and the second sequence capacitor.

3. The simulation circuit as claimed in claim 2, wherein the first switch is controlled by the second voltage, and the second switch is controlled by the first switch.

4. The simulation circuit as claimed in claim 2, wherein when the voltage of the first voltage source is greater than a write threshold field equivalent voltage of the MTJ element, the second switch is open; and when the voltage of the second voltage source is greater than the write threshold field equivalent voltage of the MTJ element, the first switch is open.

5. The simulation circuit as claimed in claim 2, wherein the state indication circuit includes:
   a third voltage source, used to indicate the state of magnetic moment direction after the next data writing;
   a fourth voltage source, used to indicate the state of magnetic moment direction before data writing;
   a state capacitor, used to record the reversal state of a magnetic moment of a freedom layer adjacent to the tunnel barrier layer;
   a third switch, connected with the third voltage source and the state capacitor to form a loop; and
   a fourth switch and a fifth switch, connected electrically between the state capacitor and the fourth voltage source.

6. The simulation circuit as claimed in claim 5, wherein when both the voltage of the first voltage source and the voltage of the second voltage source are greater than the write threshold field equivalent voltage of the MTJ element, the third switch is closed, and the third voltage source is used to charge the state capacitor.

7. The simulation circuit as claimed in claim 5, wherein when one of the voltage of the first voltage source and the voltage of the second sequence capacitor is less than the write threshold field equivalent voltage, the fourth switch is closed; and when one of the voltage of the second voltage source or the voltage of the first sequence capacitor is less than the write threshold field equivalent voltage, the fifth switch is closed.

8. The simulation circuit as claimed in claim 2, wherein the write data storage circuit includes:
   a storage capacitor;
   a fifth voltage source and a sixth voltage source, used to indicate two direction states of the magnetic moments of the free layer adjacent to the tunnel barrier layer, respectively, when the magnetic moments are in a stable state;
   a first charging route, including a sixth switch, a seventh switch, and an eighth switch, the first charging route is connected electrically between the storage capacitor and the fifth voltage source;
   a second charging route, including a ninth switch, a tenth switch, and an eleventh switch, the second charging route is connected electrically between the storage capacitor and the fifth voltage source;
   a sixth switch, controlled by the second voltage source, and is used to control the first charging route; and
   a ninth switch, controlled by the first voltage source, and is used to control the second charging route.

9. The simulation circuit as claimed in claim 8, wherein when the voltage of the first voltage source is close to 0, the ninth switch is open; and wherein when the voltage of the second voltage source is close to 0, the sixth switch is open.

10. The simulation circuit as claimed in claim 8, wherein the first charging route is controlled by the seventh switch and the eighth switch; and when the voltage of the storage capacitor is greater than the write threshold field equivalent voltage and voltage of the first voltage source is greater than the write threshold field equivalent voltage, the seventh switch is closed; and when the negative voltage of the storage capacitor is greater than the write threshold field equivalent voltage and voltage of the first voltage source is greater than the write threshold field equivalent voltage, the eighth switch is closed.

11. The simulation circuit as claimed in claim 8, wherein the second charging route is controlled by the tenth switch and the eleventh switch; wherein, when the reverse voltage of the storage capacitor is greater than the write threshold field equivalent voltage and voltage of the second voltage source is greater than the write threshold field equivalent voltage, the tenth switch is closed; and when the negative voltage of the storage capacitor is greater than the write threshold field equivalent voltage and voltage of the second voltage source is greater than the write threshold field equivalent voltage, the eleventh switch is closed.

12. The simulation circuit as claimed in claim 5, wherein the magnetic moment configuration voltage calculation circuit includes a seventh voltage source and a resistor connected in series, wherein, the voltage of the seventh voltage source represents the magnetic moment configuration voltage.

13. The simulation circuit as claimed in claim 12, wherein the voltage of the seventh voltage source is set as a linear combination of the voltage of state capacitor and the voltage of the storage capacitor.

14. The simulation circuit as claimed in claim 13, wherein when in a stable state, and when the magnetic moment alignment relation of the two ferromagnetic layers adjacent to the tunnel barrier layer is in a parallel or anti-parallel alignment, then the constant of the linear combination is set as ½.

15. The simulation circuit as claimed in claim 13, wherein when in a stable state, and when the magnetic moment alignment relation of the two ferromagnetic layers adjacent to the tunnel barrier layer is in an orthogonal alignment, then the constant of the linear combination is set as ½ and −½ or −½ and ½.

16. The simulation circuit as claimed in claim 1, wherein the characteristic simulation circuit is a voltage controlled current source, and is a linear combination of the voltage applied at both ends of the MTJ element and the magnetic moment configuration voltage.

* * * * *